United States Patent
Kub et al.

(10) Patent No.: US 9,246,305 B1
(45) Date of Patent: Jan. 26, 2016

(54) LIGHT-EMITTING DEVICES WITH INTEGRATED DIAMOND

(71) Applicants: Francis J. Kub, Arnold, MD (US); Travis J. Anderson, Alexandria, VA (US); Karl D. Hobart, Alexandria, VA (US)

(72) Inventors: Francis J. Kub, Arnold, MD (US); Travis J. Anderson, Alexandria, VA (US); Karl D. Hobart, Alexandria, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/663,486

(22) Filed: Mar. 20, 2015

Related U.S. Application Data

(60) Provisional application No. 61/955,837, filed on Mar. 20, 2014.

(51) Int. Cl.
| | |
|---|---|
| *H01S 5/00* | (2006.01) |
| *H01S 5/024* | (2006.01) |
| *H01L 33/58* | (2010.01) |
| *H01L 33/64* | (2010.01) |
| *H01L 33/32* | (2010.01) |
| *H01S 5/343* | (2006.01) |
| *H01L 33/06* | (2010.01) |
| *H01L 33/00* | (2010.01) |
| *H01S 5/20* | (2006.01) |

(Continued)

(52) U.S. Cl.
CPC ........ *H01S 5/02484* (2013.01); *H01L 33/0025* (2013.01); *H01L 33/06* (2013.01); *H01L 33/32* (2013.01); *H01L 33/58* (2013.01); *H01L 33/641* (2013.01); *H01S 5/02469* (2013.01); *H01S 5/183* (2013.01); *H01S 5/2018* (2013.01); *H01S 5/22* (2013.01); *H01S 5/34333* (2013.01)

(58) Field of Classification Search
CPC ..... H01S 5/02484; H01S 5/2018; H01S 5/22; H01S 5/34333; H01S 5/183; H01S 5/02469; H01L 33/641; H01L 33/32; H01L 33/06; H01L 33/0025; H01L 33/58
See application file for complete search history.

(56) References Cited

U.S. PATENT DOCUMENTS

| | | |
|---|---|---|
| 5,278,430 A | 1/1994 | Kakumu |
| 8,039,301 B2 | 10/2011 | Kub et al. |

(Continued)

FOREIGN PATENT DOCUMENTS

EP 653823 A2 * 5/1995 .......... H01L 23/3732

OTHER PUBLICATIONS

J. Philip, P. Hess, T. Feygelson, et al. "Elastic, Mechanical, and Thermal Properties of Nanocrystalline Diamond Films," Journal of Applied Physics 93 pp. 2164-2171 (2003).

(Continued)

*Primary Examiner* — Yuanda Zhang
(74) *Attorney, Agent, or Firm* — US Naval Research Laboratory; Joslyn Barritt

(57) ABSTRACT

A light-emitting device having one or more diamond layers integrated therein and methods for forming a light-emitting device with integrated diamond layers. The diamond is grown either directly on the semiconductor material comprising the light-emitting structure, on a nucleation layer deposited on the semiconductor material, or on a dielectric layer deposited on the semiconductor material before growth of the diamond layer. The device can include a trench or thermal shunt formed in the substrate on the backside of the device, or can include a heat sink to provide additional thermal management.

12 Claims, 16 Drawing Sheets

(51) Int. Cl.
*H01S 5/22* (2006.01)
*H01S 5/183* (2006.01)

(56) References Cited

U.S. PATENT DOCUMENTS

| | | | |
|---|---|---|---|
| 8,497,513 | B2 | 7/2013 | Kohn et al. |
| 2006/0174823 | A1 | 8/2006 | Sung |
| 2009/0059983 | A1* | 3/2009 | Hasegawa et al. ......... 372/44.01 |
| 2009/0325334 | A1* | 12/2009 | Kwak et al. .................... 438/46 |
| 2011/0297958 | A1 | 12/2011 | Kub et al. |
| 2013/0044322 | A1* | 2/2013 | Feitisch et al. ................ 356/432 |
| 2013/0306988 | A1 | 11/2013 | Kub et al. |
| 2013/0306989 | A1 | 11/2013 | Kub et al. |
| 2014/0110722 | A1 | 4/2014 | Kub et al. |
| 2014/0264777 | A1 | 9/2014 | Hobart et al. |
| 2015/0056763 | A1 | 2/2015 | Hobart et al. |

OTHER PUBLICATIONS

P.R. Chalker, T.B. Joyce, C. Johnston, J.A.A. Crossley, J. Huddlestone, M.D. Whitfield, and R.B. Jackman, "Fabrication of aluminium nitride/diamond and gallium nitride/diamond Saw devices," Diamond and Related Materials 8 (1999) 309-313.

F. Faili, Q. Diduck, D.I. Babic, D. Francis, F. Ejeckam, and J.D. Blevins, "Development of III-Nitride HEMTs on CVD Diamond Substrates," CS MANTECH Conference, May 16-19, 2011.

\* cited by examiner

LIGHT-EMITTING DEVICES WITH INTEGRATED DIAMOND

CROSS-REFERENCE

This Application is a nonprovisional of and claims the benefit of priority under 35 U.S.C. §119 based on U.S. Provisional Patent Application No. 61/955,837 filed on Mar. 20, 2014, the entirety of which is incorporated into the present disclosure.

BACKGROUND

The past several years have seen remarkable improvement in laser technology. Much of this is due to improvements in material growth, device design and device fabrication. Despite significant improvements in efficiencies, it is becoming increasingly clear that III-nitride laser are limited by the ability to dissipate heat and thus must run at significantly reduced pulse length and duty cycle. Recent thermal simulations indicate that the substrate is not the primary source of the thermal impedance, rather it is the ability of the GaN to locally spread the heat to the surrounding material and substrate due to the extraordinarily high power dissipation density in the light generation device region.

Many groups have studied CVD polycrystalline diamond films. More recently nanocrystalline diamond (NCD) films have gained significant attention due to their high nucleation density and excellent thermal, mechanical, and electrical properties. See e.g., J. Philip, P. Hess, T. Feygelson, et al. "Elastic, Mechanical, and Thermal Properties of Nanocrystalline Diamond Films," Journal of Applied Physics 93 pp. 2164-2171 (2003)

Much different from the CVD polycrystalline diamond films from the past, NCD films can be extremely smooth, dense and have very low in-grown stress. The improvement in NCD films is a direct result of a new seeding process based on the uniform coating with 'detonation nanodiamond' seeds on the target substrate surface. The nanodiamond particles are on the order of 3-5 nm and with appropriate 'seeding' conditions very high surface densities ($>1 \times 10^{12}$ cm$^{-2}$) can be achieved. Such high seeding densities result in high nucleation density and very high quality, pin-hole-free and dense films.

Factors such as deposition temperature, chemistry, and growth conditions also play a large role in NCD film quality. Key NCD film properties are surface roughness, nucleation interface density, pinhole density, thermal conductivity, electrical resistivity, dielectric loss, and impact on the host substrate/films. Obtaining the highest quality NCD films while minimizing the impact on the target heterostructures is one of the major goals of this program. High quality NCD seeding and film growth are typically obtained under conditions that may not be compatible with those of the host substrate.

Key issues include the optimum NCD seeding and film deposition conditions in order to maintain high quality 2DEG in the target films is critical and will be the first area investigated under the proposed program. Understanding the fundamental electrical behavior of diamond on GaN will be the second task investigated under the program. Optimizing the overall III-nitride laser structure to include a heat spreading layer and a thin first dielectric layer. Diamond, like GaN, is a wide bandgap material and can have very high resistivity, however the effective band offset between diamond and GaN may be type II and thus tunneling into the diamond may be an issue. This impacts the dielectric between the GaN and the diamond, thus potentially reducing the heat spreading effect offered by diamond. Another consideration is that the preferred passivation layer for GaN is typically an ex-situ plasma deposited or in-situ grown SiN layer.

Thus, it is desirable to incorporate diamond films in III-nitride semiconductor lasers to improve thermal management in such devices.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides a light-emitting device having one or more diamond layers integrated therein and methods for forming a light-emitting device with integrated diamond layers.

In some embodiments, the diamond is grown directly on the semiconductor material comprising the light-emitting structure while in other embodiments, the diamond is grown on a nucleation layer deposited on the semiconductor material.

In still other embodiments, a dielectric layer is deposited on the semiconductor material before growth of the diamond layer.

In some embodiments, the light-emitting device includes a trench or thermal shunt formed in the substrate on the backside of the device, and in some embodiments, the device further includes a heat sink to provide additional thermal management to the device.

DETAILED DESCRIPTION

Figure 1B:
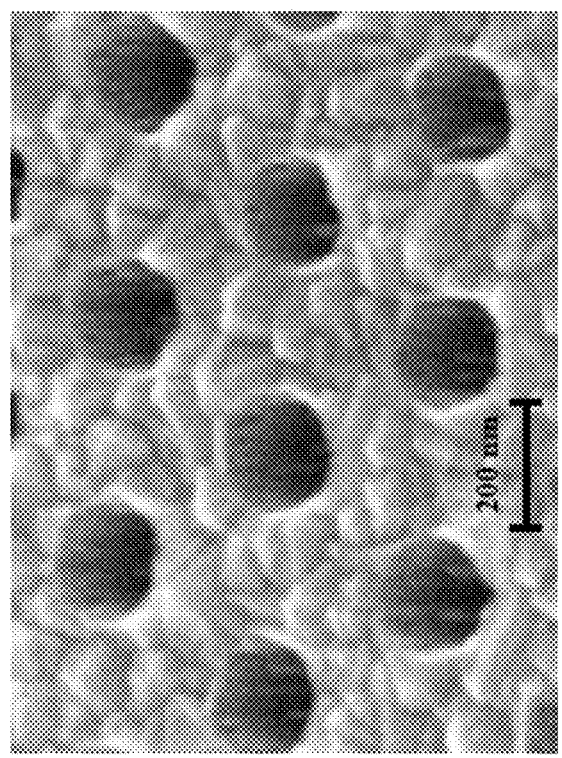
FIGS. 1A and 1B are micrographs depicting an atomic force micrograph (AFM) image of a nanocrystalline diamond (NCD) film (FIG. 1A) and a scanning electron micrograph (SEM) image of a fine-patterned NCD film (FIG. 1B), both films being grown and/or patterned at the Naval Research Laboratory.

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention provides various embodiments of a light-emitting device structure incorporating one or more chemical vapor deposition diamond layers therein.

For the last several years, scientists at the Naval Research Laboratory, including the inventors of the present invention, have conducted research regarding the growth of diamond on semiconductor materials and the integration of diamond layers into semiconductor devices to improve their thermal management. See e.g., U.S. Pat. No. 8,039,301, "Gate After Diamond Transistor," issued to Francis J. Kub and Karl Hobart; U.S. Patent Application Publication No. 2015/0056763, "Selective Deposition of Diamond in Thermal Vias," by Karl D. Hobart, Tatyana I. Feygelson, Eugene A. Imhoff, Travis J. Anderson, Joshua D. Caldwell, Andrew D. Koehler, Bradford B. Pate, Marko J. Tadjer, Randijer S. Sandhu, Vincent Gambin, Gregory Lewis, Ioulia Smorchkova, Mark Goorsky, and Jeff McKay; U.S. Patent Application Publication No. 2014/0110722, "Semiconductor Structure or Device Integrated with Diamond," by Francis J. Kub, Karl D. Hobart, and Travis J. Anderson; U.S. Patent Application Publication No. 2014/0264777, "Nanocrystalline Diamond Three-Dimensional Films in Patterned Semiconductor Substrates," by Karl D. Hobart, Marko J. Tadjer, Tatyana I. Feygelson, Bradford B. Pate, and Travis J. Anderson; U.S. Patent Application Publication No. 2013/0306988, "Diamond and Diamond Composite Material," by Francis J. Kub, Charles R. Eddy, Boris N. Feygelson, and Scooter Johnson; U.S. Patent Application Publication No. 2013/0306989, "Diamond and Diamond Composite Material," by Francis J. Kub, Charles R. Eddy, Boris N. Feygelson, and Scooter Johnson; U.S. Patent Application Publication No. 2011/0297958, "Gate After Diamond Transistor," by Francis J. Kub and Karl Hobart; and U.S. patent application Ser. No. 14/471,310, "Transistsor with Diamond Gate" by Andrew D. Koehler, Travis J. Anderson, Marko J. Tadjer, Tatyana I. Feygelson, and Karl D. Hobart, all of which are hereby incorporated by reference into the present disclosure in their entirety.

The previous inventions relate to the integration of diamond layers with electronic devices. In contrast, the present invention relates to the integration of one or more diamond layers with light-emitting devices.

Integrating diamond layers into a light-emitting device is much more difficult than integrating diamond into an electronic device.

There are two primary types of light-emitter. A laser light-emitter has an optical cavity, often in the form of a Fabry-Perot cavity, which generates light by a process of stimulated emission, while a light-emitting diode generates light by the mechanism of spontaneous light emission.

In accordance with the present invention, one or more diamond layers can be incorporated into either type of light-emitting device.

A key challenge for integrating diamond layers with light-emitting devices relates to optimizing the device design for forming optical cavities and optical waveguides. The index of refraction of the diamond significantly affects the formation of optical cavities and optical waveguides. Because of Snell's law, a lower index of refraction material is typically required on the outer surface of an optical cavity or optical waveguide relative to the index of refraction of the material within the optical cavity or optical waveguide. Depending on the material used for the light-emitting structure and the type of light-emitting device, one or more intermediate layers between the device and the diamond layer may be needed to obtain the requisite combination of indices of refraction.

Figure 1A:
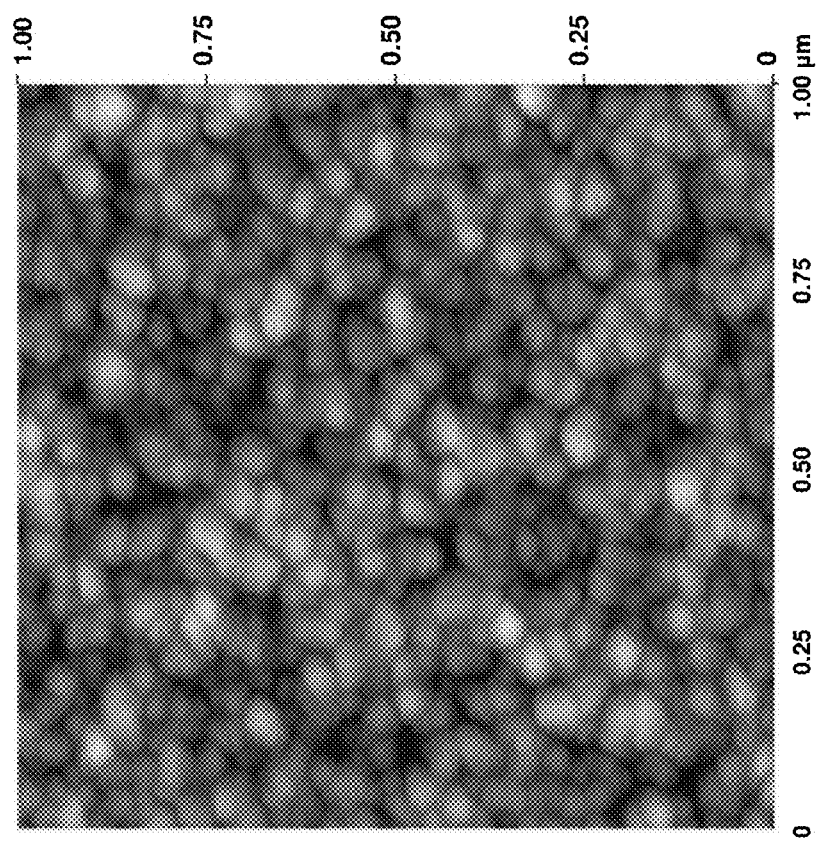

As noted above, the inventors of the present invention have done extensive research regarding diamond, its growth, and its use in semiconductor devices as a thermal management material. FIGS. 1A and 1B are micrographs illustrating diamond films grown by the present inventors at the Naval Research Laboratory (NRL), where FIG. 1A is an atomic force micrograph of a typical diamond film grown at NRL, and shows a 200-nm diamond film having a roughness of 3 nm rms, and FIG. 1B shows a scanning electron micrograph of a fine-patterned diamond film grown at NRL.

Figure 2B:
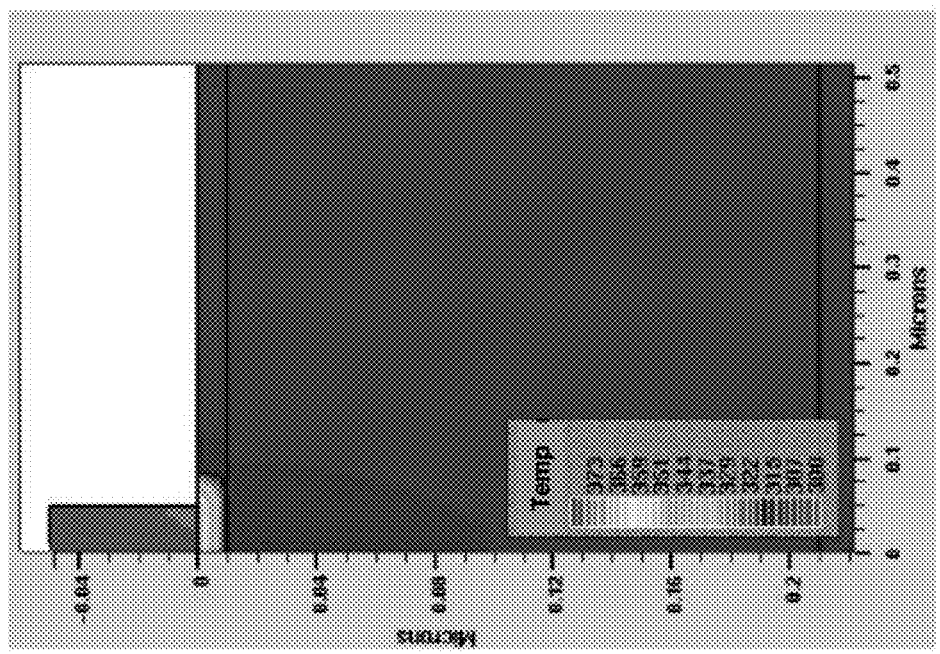
FIGS. 2A and 2B show plots illustrating the results of simulations of heat-transfer properties for silicon-on-insulator ("SOT") (FIG. 2A) and silicon-on-diamond ("SOD") (FIG. 2B) devices performed at NRL.
Figure 2A:
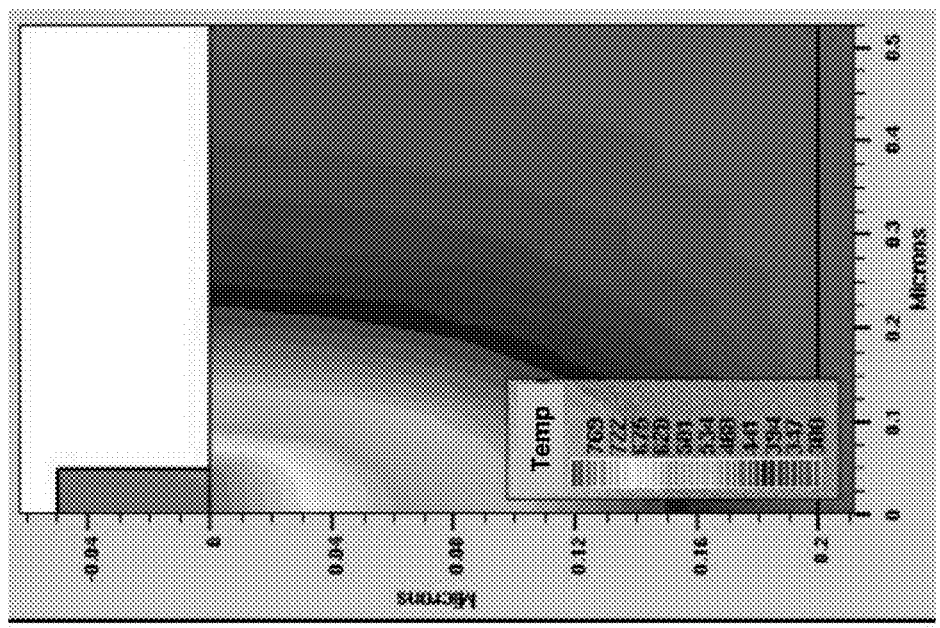

The plots in FIGS. 2A and 2B illustrate the results of simulations of heat-transfer properties for silicon-on-insulator ("SOI") (FIG. 2A) and silicon-on-diamond ("SOD") (FIG. 2B) devices performed at NRL, where both devices are on a silicon host substrate (SOD has thin oxide layer as well). A comparison of the thermal profiles of the SOI and SOD devices shown in FIGS. 2A and 2B, respectively, shows significant heat confinement for the SOI device whereas heat transfer to the substrate is clearly observed in the SOD device, resulting in significantly lower device operating temperature.

As described in more detail below, devices in accordance with the present invention include a light-emitting structure having a diamond layer disposed thereon. Integrating one or more diamond films into the light-emitting device structure in accordance with the present invention can locally spread the thermal power dissipated near the active light generation region, resulting in significant total power output improvements and improved overall device performance.

In some embodiments, the light-emitting structure is formed from a III-nitride material, while in others it is formed from a III-V semiconductor material. In some embodiments, the light-emitting structure is in the form of an edge-emitting laser, in other embodiments, it is a surface-emitting laser, while in still other embodiments, it is a light-emitting diode. In some embodiments, a device in accordance with the present invention can include one or more anode ohmic metal, anode metal, cathode ohmic metal, and/or cathode metal contacts where the anode and/or cathode elements can be formed either before or after the deposition of the diamond layer.

Laser devices having one or more diamond layers integrated therein in accordance with the present invention can also include embodiments having one or more dielectric layers formed between the III-nitride material and the diamond layer and embodiments wherein the diamond is grown directly on the III-nitride material; embodiments having one or more diamond-coated trenches formed in the substrate; and/or one or more diamond-coated thermal shunts formed in the substrate.

These and other embodiments will now be described with respect to FIGS. 3-16. It will be noted that in FIGS. 3-16 and in the description below, to avoid unnecessary redundancies and to streamline the description of the embodiments illustrated in the FIGURES, only elements that are newly introduced in a particular FIGURE are specifically identified by reference numbers and described in the disclosure related to the embodiment depicted in that FIGURE; once an element has been identified by a reference number and described with respect to that reference number, that element is not specifically identified by a reference number in a subsequent FIGURE nor is it described unless that element is relevant to the embodiment depicted therein and described with respect to that FIGURE. In addition, when such repeated elements are described, the equivalent elements in different FIGURES are given the same reference number, differing only by the first digit(s). For example, the diamond layer is given reference number 309 in FIG. 3, reference number 409 in FIG. 4, reference number 509 in FIG. 5, etc.

Figure 3:
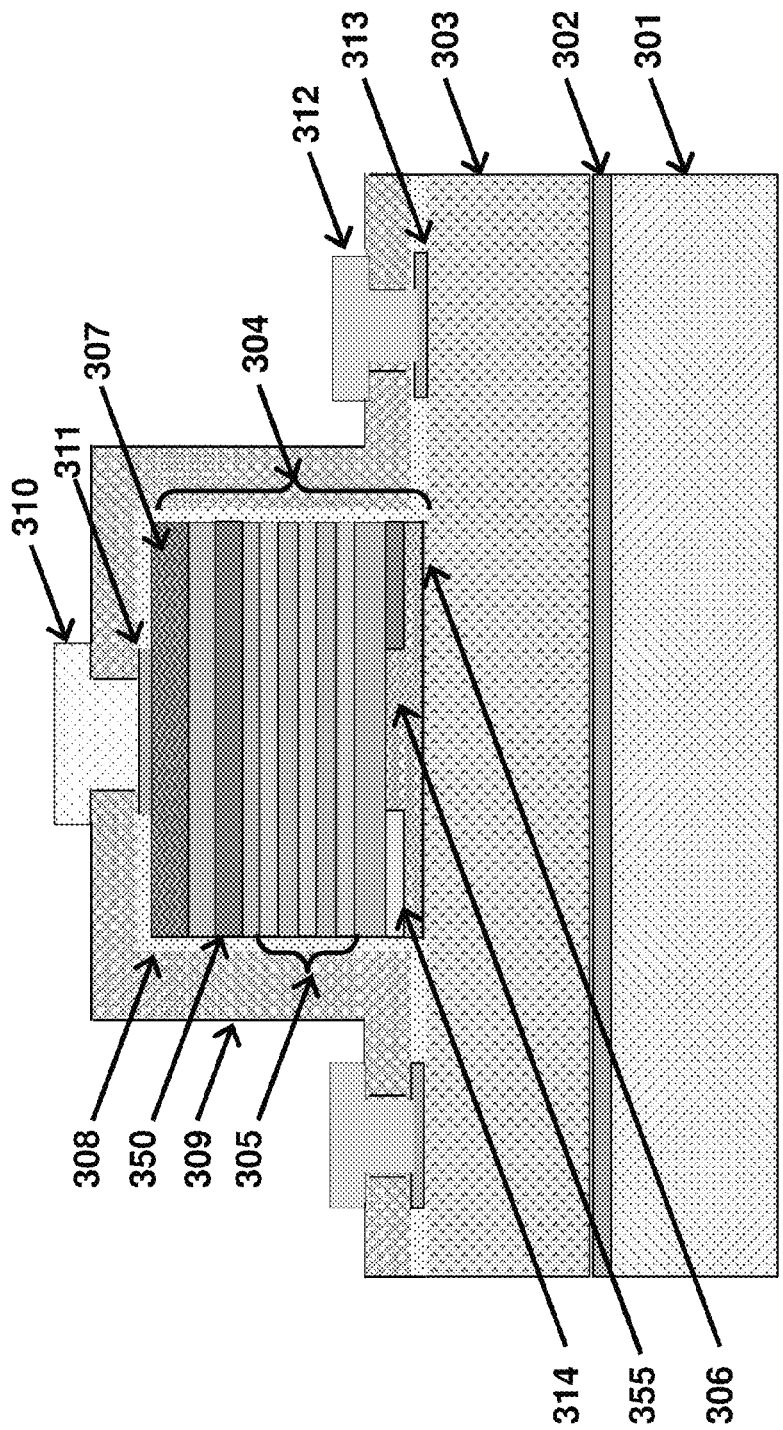
FIG. 3 is a block diagram depicting, in cross-section, an exemplary embodiment of a light-emitting device with integrated diamond in accordance with one or more aspects of the present disclosure.

A general case embodiment of a light-emitting device having one or more diamond layers integrated therein in accordance with one or more aspects of the present invention is illustrated in the block diagram shown in FIG. 3, which shows, in cross-section, the elements typically present in such a device.

Thus, as illustrated in FIG. 3, such a device includes light-emitting structure 303 formed from a III-nitride or a III-V semiconductor material grown on substrate 301 via nucleation layer 302, typically by MOCVD or MBE, though any other suitable growth method may be used. The III-nitride material layers are typically grown at a higher temperature than the III-V material layers and in addition, the III-nitride material layer typically can survive higher processing step temperatures than III-V material layers, though the properties of quantum wells within both III-nitride or III-V light-emitting devices can degrade by such high temperature processing steps. For example, there can be increased surface roughness at the interface of material layers within the quantum well or phase separation of ternary material layers within the quantum well for III-nitride and III-V light-emitting devices.

In some embodiments, the light-emitting structure includes a light generating active region and light guiding structure which, as shown in FIG. 3, may be in the form of a ridge waveguide 304 formed from the III-nitride or III-V semiconductor material, for example, by a mesa etch. Waveguide 304 also includes one or more quantum wells which form light-generating active region 305, which produces photons when electrical current flowing through the quantum well region of the diode causes electron/hole recombination in the quantum wells in a manner well known in the art. In most embodiments, waveguide 304 also includes a P-type anode 307 above the quantum well active region 305 and an N-type cathode 306 contacting the surface of the N+ layer 303. In some embodiments, waveguide 304 can also include an electron blocking layer 350 to improve the efficiency of the light-emitting device. In some embodiments, the device may also include a current aperture 355 formed from patterned material layer 314.

In accordance with the present invention, a diamond layer 309 is formed over the light-emitting structure, including over waveguide 304 and N+ layer 303. In some embodiments, diamond layer 309 is formed from a diamond nucleation layer 308 disposed on light-emitting structure 304, while in other embodiments, such as the embodiment illustrated in FIG. 4, the diamond layer (shown as element 409 in FIG. 4) is formed directly on the light-emitting structure. In other embodiments, described in more detail below with respect to FIG. 5, a dielectric material layer can be disposed between the light-emitting structure and the diamond nucleation layer to confine the light.

The light-emitting device further includes an anode 310 formed on P-type layer 307 on a frontside of the light-emitting device, which may optionally also include separate anode ohmic material 311, and further includes one or more cathodes 312 with optional separate cathode ohmic material 313 formed on the N-type layer 303. As described in more detail below, in some embodiments, the anode and cathode can be formed before formation of the diamond material on the light-emitting structure while in other embodiments, they can be formed after formation of the diamond material.

These aspects and other embodiments of a light-emitting device having one or more diamond layers in accordance with the present invention are described in more detail below.

Substrate and III-Nitride Material Layers

The substrate used in a light-emitting device in accordance with the present invention can be formed from any suitable material, such as SiC, GaN, sapphire, AlN, or AlGaN.

As noted above, in some embodiments, the N+ layer forming the light-emitting device is formed from a III-nitride material such as AlGaN or GaN, while in other embodiments, the N+ layer is formed from other III-V materials such as GaAs, InP, or GaP.

Optionally, an in-situ dielectric layer (typically in-situ silicon nitride layer but can also be silicon oxide layer, an aluminum nitride layer, and/or metal oxide layer) can be grown on the surface of the III-nitride layer while the substrate is within the MOCVD or MBE growth system. The advantage of an in-situ dielectric layer is that the III-nitride surface is not exposed to a hydrogen ambient that is present in the diamond deposition tool. In addition, an AlGaN or GaN surface can be passivated with an in-situ grown dielectric layer without a need to remove a native oxide layer.

Diamond and Diamond Nucleation Layer

As noted above, a light-emitting device in accordance with the present invention includes one or more diamond layers formed on the surface of the light-emitting structure.

Methods for growing the diamond film may include but not be limited to microwave plasma chemical vapor deposition and hot filament chemical vapor deposition. Additional details regarding techniques for nucleation and growth of diamond films on III-nitride and III-V semiconductor materials can be found in U.S. Patent Application Publication No. 2014/0110722, "Semiconductor Structure or Device Integrated with Diamond," supra; U.S. Patent Application Publication No. 2013/0306988, "Diamond and Diamond Composite Material," supra; and U.S. Patent Application Publication No. 2013/0306989, "Diamond and Diamond Composite Material," supra, and will not be repeated here for the sake of brevity.

Figure 4:
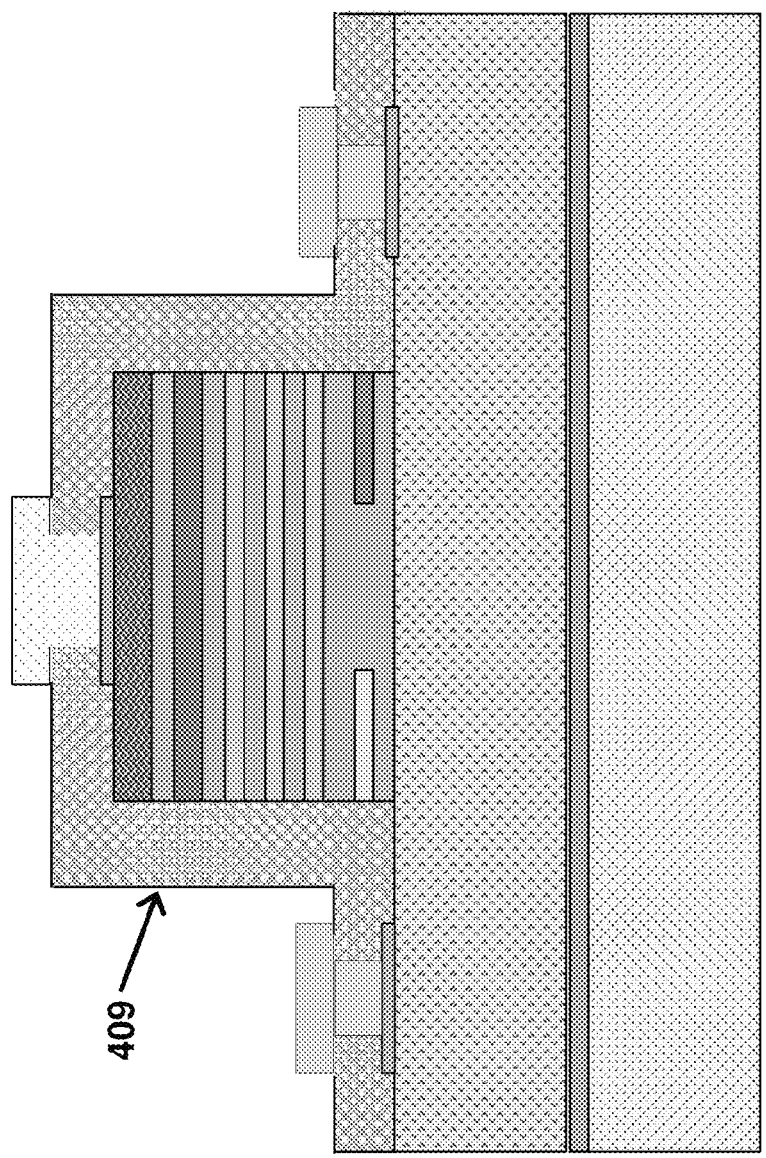
FIG. 4 is a block diagram depicting, in cross-section, another exemplary embodiment of a light-emitting device with integrated diamond in accordance with one or more aspects of the present disclosure.

In some embodiments, such as in the embodiment illustrated in FIG. 4, the diamond layer, shown as diamond layer 409 in FIG. 4, is grown directly on the surface of the material (e.g., AlGaN or GaN) forming the light-emitting structure without any intermediate nucleation layer or dielectric layer between the light-emitting structure and the diamond. In such embodiments, it is desirable to expose the AlGaN or GaN surface to a nitrogen plasma to react nitrogen with the AlGaN or GaN surface to try to minimize the number of nitrogen vacancies at the AlGaN or GaN surface prior to the deposition of the diamond particle nucleation layer.

In other embodiments, however, bias-enhanced nucleation methods may be used to nucleate a diamond film on the III-nitride or III-V material surface. In such embodiments, a layer of diamond nucleation particles (preferably nanocrystalline diamond particles) is deposited on the surface of the optional first dielectric layer and ohmic metal layer to form a diamond particle nucleation layer. The nucleation layer can be formed from any suitable material such as AlN or low temperature GaN. The diamond film is then grown on the diamond particle nucleation layer, with the diamond film typically being grown by a plasma deposition process deposition or thermal filament process in an atmosphere of a carbon containing precursor (methane, propane, etc.), hydrogen, and inert gases such as argon.

As described in more detail below, in some embodiments, the diamond is grown before formation of the anode and cathode contacts in the light-emitting device. In other embodiments, the diamond is grown after formation of one or more of the anode and cathode contacts, and in such cases, the diamond should be grown at a temperature sufficiently low that the metal in the anode and cathode contacts is not damaged, typically less than about 750° C.

Whether grown directly by means of a nucleation layer or directly on the semiconductor material, the diamond film will typically have a thickness of about 100 nm to about 5 µm.

In some embodiments, the resistivity of the nanocrystalline diamond layer is selected to be insulating, while in other embodiments, the resistivity of the diamond thin film layer can be selected to be semi-insulating. The advantage of a semi-insulating diamond thin film is that it will be able to conduct charge that is injected into the layer to prevent the buildup of charge regions that can create locations of high electric field that can cause lower breakdown voltage for the device.

In all embodiments, the deposited diamond layer may improve the lateral thermal conduction of heat that is generated in the area of the active region of the device to help spread the heat to a larger area where the heat can be conducted vertically through the substrate to additional material layers on the backside of the substrate that can further help conduct heat away from the device. The AlN/GaN and AlGaN layers for a GaN laser will typically be grown on a SiC substrate, a GaN substrate, sapphire substrate, an AlN substrate, or an AlGaN substrate. The substrate will typically have a thermal conductivity of >200-300 W/mK, a GaN substrate can have a thermal conductivity of greater than W/mK. The lateral heat spreading of the diamond layer will increase the area for thermal conduction of the heat and thus reduce the thermal impedance for heat conduction.

Optional Dielectric Layer

As noted above, in some embodiments, a light-emitting having a diamond layer integrated therein will include a dielectric layer disposed between the diamond nucleation layer (or diamond layer if the diamond is formed directly on the surface of the light-emitting structure without a nucleation layer).

The advantage of a structure without a dielectric layer is that the diamond is in direct contact with the AlGaN surface to achieve the maximum thermal conductivity.

There may be, however, a number of disadvantages to a structure that does not use a dielectric layer between the semiconductor material and the diamond (or diamond nucleation particle layer).

For example, growth of the diamond can cause damage to the waveguide structure. The diamond particle nucleation layer is deposited using ultrasonic agitation, and there is a possibility that the GaN surface can be damaged from the energy of the diamond nanoparticles impacting the surface. The diamond growth gas environment can also cause the GaN surface to decompose. In addition, the surface state density and/or fixed oxide charge for a diamond layer deposited on the semiconductor surface of the waveguide (either directly or via a nanocrystalline nucleation layer) is not as low as is the case for a diamond layer grown on a dielectric deposited directly on the AlGaN/GaN surface.

Moreover, in order to produce the desired optical output of from the light-emitting device, it is desirable that the waveguide outer "cladding" layer(s) comprising at least one diamond layer around the core of the waveguide have an index of refraction that is lower than the index of refraction of the core of the waveguide material, on at least the sidewalls of the waveguide structure.

Diamond has an index of refraction n of 2.417. Thus, if the waveguide is formed from a III-V material such as InP, which has an index of refraction of 3.590, or GaAs, which has an index of refraction of 3.948, no intermediate dielectric layer on the surface of the core of the waveguide is needed to provide the desired optical properties of the device, and the diamond layer and the diamond nucleation layer can be deposited directly on the III-V material layer. However, if the core of the waveguide is formed from a III-nitride material such as GaN, which has an index of refraction of 2.339, i.e., that is lower than that of diamond, the waveguide outer cladding material layer(s) may be modified so that it has an index of refraction lower than that of the material layer comprising the core of the waveguide. This can be accomplished by depositing a layer of a material having an index of refraction lower than that of the material forming the core of the waveguide on at least the sidewalls of the waveguide structure before growth of the diamond material layer on the structure.

Figure 5:
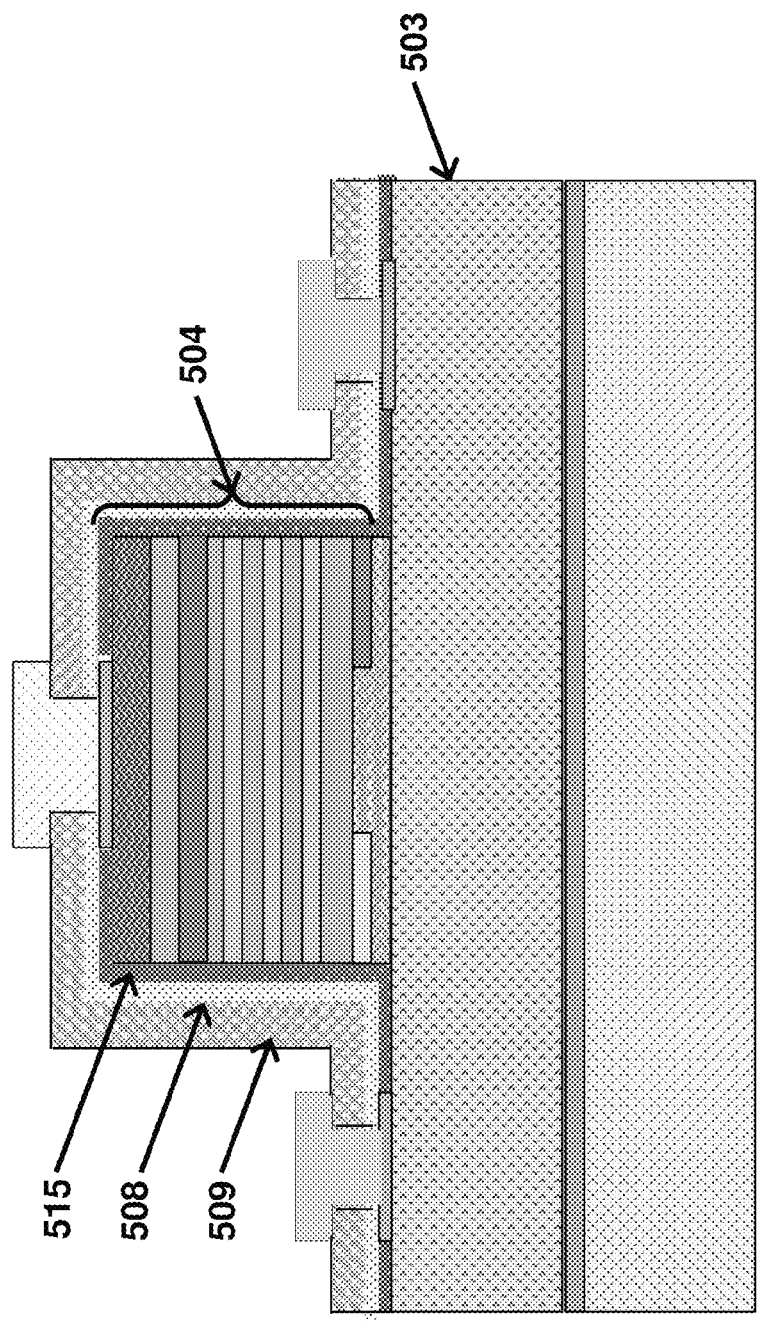
FIG. 5 is a block diagram depicting, in cross-section, another exemplary embodiment of a light-emitting device with integrated diamond in accordance with one or more aspects of the present disclosure.

For these reasons, it is often desirable for a light-emitting structure, optical cavity structure, or light guiding structure in accordance with the present invention to include a dielectric layer 515 deposited onto the AlGaN (or GaN) light-emitting structure 503 and waveguide 504 prior to the deposition of diamond nucleation layer 508 and/or diamond layer 509, as in the embodiment illustrated in FIG. 5. In some embodiments, an optional anneal at approximately 600° C. can be performed to increase the dielectric strength of an ex-situ deposited dielectric layer.

Dielectric layer 515 should be optimized for the capability to have good passivation qualities such as low surface state density, and should be sufficiently thin so that the thermal impedance to the diamond heat spreading layer is low.

In some cases it may be preferable that dielectric layer 515 have a high thermal conductivity. For example, aluminum nitride has a thermal conductivity of about 250 W/mK, aluminum oxide has a thermal conductivity of about 12 to 38 W/mK, silicon nitride has a thermal conductivity of about 15 W/mK, and silicon oxide has a thermal conductivity of about 1.5 W/mK.

In some cases it may be desirable that dielectric layer 515 have a low hydrogen diffusion coefficient. The hydrogen diffusion coefficient of silicon nitride film is about $1 \times 10^{-19}$ cm$^2$/s and the hydrogen diffusion coefficient is about $1 \times 10^{-11}$ cm2/s.

Dielectric layer 515 may be formed from any suitable thermally conductive material having a lower index of refraction than AlGaN (or GaN), such as SiN, SiO2, SiOx, Al$_2$O$_3$, HfO2, AlON, or combinations thereof. Methods for depositing the dielectric layer may include but not limited to chemical vapor deposition, plasma enhanced chemical vapor deposition, sputtering atomic layer deposition, and atomic layer epitaxy. A chemical clean, plasma clean, or sputter cleaning may optionally be performed prior to deposition of dielectric layer 515, where the cleaning process may include a plasma nitrogen step to react nitrogen with the AlGaN or GaN surface to minimize nitrogen vacancies at the AlGaN or GaN surface.

Dielectric layer 515 can comprise one or more in-situ grown dielectric layers, one or more ex-situ grown dielectric layers, or a combination of one or more in-situ grown dielectric layers and one or more ex-situ grown dielectric layers, where some of the thin dielectric layers can also perform the function of an insulator dielectric. In-situ and ex-situ dielectric layers will typically be in the form of SiN or SiO layers; thin film layers of a metal oxide such as Al$_2$O$_3$, HfO, lanthanum oxide, Gd$_2$O$_3$, or Sc$_2$O$_3$; layers or a composite dielectric consisting of a combination of SiN, SiO, and/or a metal oxide. Dielectric layers growth in-situ will typically be grown by a chemical vapor deposition (CVD), metal organic chemical vapor deposition (MOCVD), molecular beam Epitaxy (MBE) or plasma deposition technique, while dielectric layers grown ex-situ can be grown using any suitable thin film growth technique, including atomic layer deposition (ALD), and are deposited in a system other than the original AlGaN/GaN growth system.

For example, a dielectric layer 515 in a light-emitting device having integrated diamond in accordance with the present invention can be in the form of a 1 nm thick in-situ grown SiN layer followed by an ex-situ 3-nm thick Al$_2$O$_3$ layer formed by ALD. If an in-situ SiN layer is not used, it is desirable to expose the AlGaN or GaN surface to a nitrogen plasma to react nitrogen with the AlGaN or GaN surface to reduce the number of nitrogen vacancies at the surface prior to the deposition of the ex-situ dielectric layer.

In addition to providing a transitional layer to ensure a proper balance of the index of refraction between the waveguide and the diamond cladding, optional dielectric layer 515 can provide the following additional benefits.

Dielectric layer 515 can passivate the GaN (or AlGaN) surface of light-emitting structure 503 and waveguide 504 to achieve low interface state density or the preferred fixed charge in the dielectric. This thin dielectric film will typically be a silicon nitride deposited layer but can be an Al$_2$O$_3$ deposited layer, AlN deposited layer, HfO$_2$ deposited layer, and other metal oxide deposited layer or combination of preceding layers. The best surface passivation of GaN is typically obtained for silicon nitride layer deposited directly on GaN or AlGaN or AlN surface.

Dielectric layer 515 can act as an etch stop layer for selective diamond etching such as the etching described above with respect to formation of the anode and cathode after deposition of the diamond film. Diamond layer 509 will typically be etched by an oxygen reactive ion etch (RIE) process, and in such cases, dielectric material layers such a silicon nitride, silicon oxide, hafnium oxide, aluminum oxide, etc. can act as an etch stop layer. Dielectric layer 515 can also protect the surface of the light-emitting structure during the etching process, since if the GaN (or AlGaN) surface were exposed to an oxygen RIE etch, it would be damaged, which would degrade an anode metal formed in the damaged area.

Dielectric layer 515 can protect the GaN or AlGaN surface from damage during the diamond deposition process. The diamond deposition process typically uses the ultrasonic deposition of nanocrystalline diamond particles that act as a nucleation layer for diamond growth. The diamond particles accelerated by ultrasonic energy can collide with the GaN surface causing mechanical damage.

Dielectric layer 515 can also protect the AlGaN or GaN surface from chemical decomposition during the growth of the diamond film. The growth environment for diamond typically include CH4/H2 gas mixture and these gases can decompose the GaN surface at typical diamond growth temperatures. A thin layer of silicon nitride or other dielectric material should protect the GaN surface during diamond growth.

Dielectric layer 515 can act as an ion damage protection layer. The plasma within the diamond deposition tool typically produces ions with energy of about several hundred eV energy. The ions can typically penetrate about 20 nms into material layers. Thus, a dielectric layer 515 thicker than about 20 nm can be an ion damage protection layer to prevent the creation of displacement damage in the semiconductor material.

Anode and Cathode Formation

As noted above, a light-emitting device in accordance with the present invention includes at least one anode 310 and at least one cathode 312, where the anode and cathode may also include optional separate anode ohmic metal contact 311 and optional separate cathode ohmic metal contact 313.

In some embodiments, as illustrated in FIG. 3, both anode 310 and cathode 312 (and optional separate anode and cathode ohmic metal contacts 311 and 313, respectively, where present) are formed above the active region of the of light-emitting structure 303, with anode 310/anode ohmic metal contact 311 being formed on an upper surface of the waveguide ridge 304 and cathode 312/cathode ohmic metal contacts 313 being formed on an upper surface of light-emitting structure 303 on either side of waveguide ridge 304.

In some embodiments, the anode and cathode contacts are formed after deposition of the diamond layer on the light-emitting structure. Details regarding formation of ohmic anode and cathode contacts after deposition of a diamond material layer are set forth in U.S. Pat. No. 8,039,301, "Gate After Diamond Transistor," supra, which is incorporated into the present disclosure, and will not be repeated here in their entirety for the sake of brevity.

In such embodiments, the diamond is etched to the surface of optional dielectric layer 515 shown in FIG. 5 and/or to the surface of the GaN or AlGaN light-emitting structure. In most embodiments, a photolithography process is performed to define the region where the diamond will be etched, with the typically being by oxygen reactive ion etching (RIE etching) (or a RIE process that includes oxygen or fluorine). The resist for the RIE etching can be UV hardened to increase the resistance to oxygen RIE etching of the resist. Alternately, a hard mask composed of a thin film material such as metal, oxides (SiO2 or metal oxides such as $Al_2O_3$), silicon nitride ($Si_3N_4$) or amorphous silicon or polycrystalline silicon can be defined by the photolithography step and then the hard mask can be used as the mask layer for the oxygen RIE etch.

In some embodiments where it is present, the optional dielectric layer 515 shown in FIG. 5 can act as an etch stop for the diamond RIE etch, with the dielectric layer subsequently being etched to the AlGaN or GaN surface. In other embodiments, the dielectric layer can be left unetched and can be used as N-type insulator dielectric layer. If the RIE etch is performed to the AlGaN or GaN surface, a clean and/or etch step, e.g., using an $NH_4OH$ solution, is performed to clean the surface prior to the anode metal deposition, In some embodiments, a second thin dielectric layer optionally can be deposited within the etched opening in the diamond layer and on the surface of the AlGaN or GaN material forming the waveguide before the anode metal deposition step. Deposition can be by any suitable process such as ALD, CVD, or plasma deposition.

After etching of the diamond and deposition of the second thin dielectric layer, if present, the anode metal is deposited and defined. The anode metal may overlap the RIE etched opening in the diamond film on both sides of the opening. The cathode metal is next deposited and defined. The cathode metal may overlap the RIE etched opening in the diamond film on both sides of the opening. For both the anode and cathodes, it is desirable from lateral thermal conductivity standpoint that a thick diamond layer be present on either side of the anode and cathode.

A self-align process can also be used to form the anode metal and/or cathode. In such a case, the resist that is used to define the anode metal opening can also be used as a lift-off layer for the anode metal.

An anode metal can also be formed using a lift-off approach. The opening in the diamond layer over the ohmic contacts can be formed at the same times as the opening in the diamond for the anode metal formation.

Alternately, the opening in the diamond layer to the ohmic contact but can also be formed in a separate photostep and etching process. Following anode metal fabrication, thick contact metal would sandwich the diamond between the anode and cathode ohmic and the thick Au overlayer to improve lateral heat dissipation away from the anode-cathode area.

In embodiments where the optional separate anode and cathode metal contacts are present, they can be formed using any suitable photolithography and metal deposition techniques, with deposition of cathode ohmic metal and a wash out of the resist. An anneal process may be performed to lower the ohmic contact resistance. If the optional in-situ dielectric layer is sufficiently thin, the ohmic metal alloy will spike through the thin in-situ dielectric layer and it will not be necessary to form a contact window photostep to make an opening in the in-situ dielectric layer for direct contact of the ohmic metal to the AlGaN or GaN material.

Figure 6:
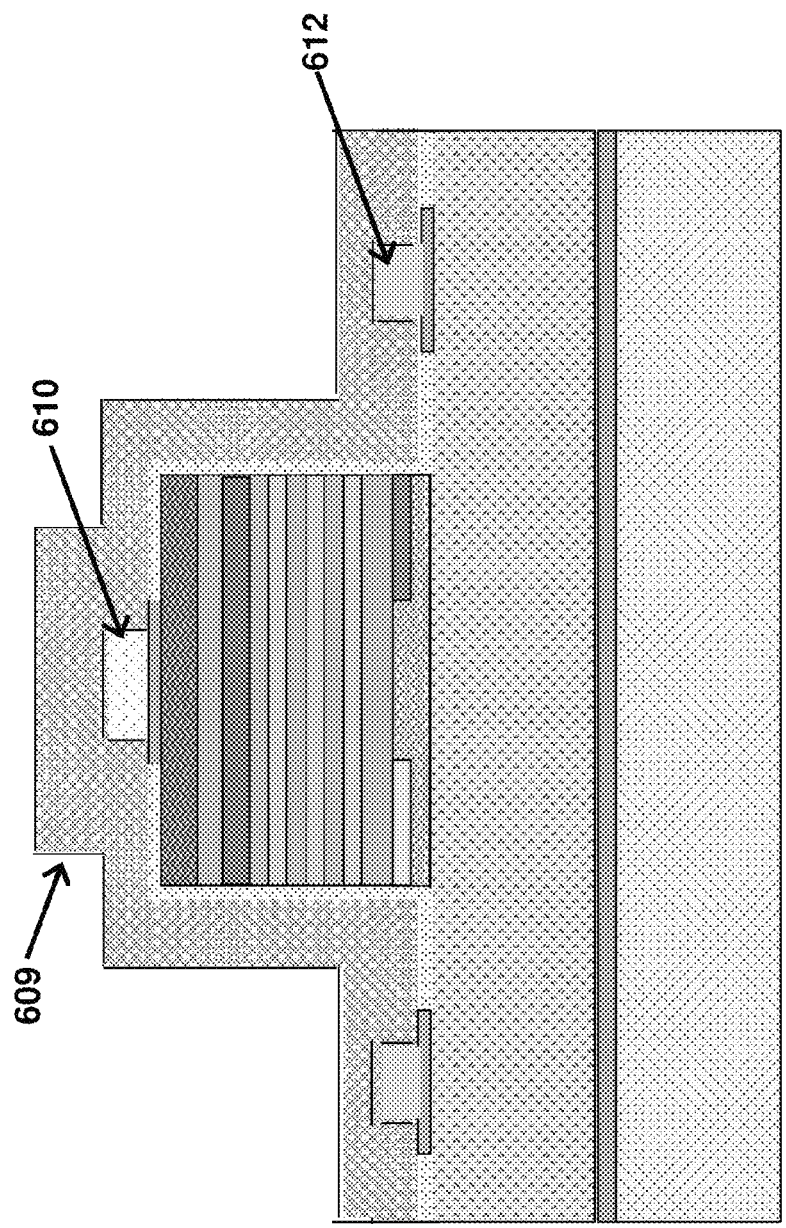
FIG. 6 is a block diagram depicting, in cross-section, another exemplary embodiment of a light-emitting device with integrated diamond in accordance with one or more aspects of the present disclosure.

In other embodiments, aspects of which are illustrated in FIG. 6, the diamond layer is formed after formation of the anode and cathode contacts. In some such embodiments, such as the case illustrated in FIG. 6, diamond layer 609 can be grown so that it partially or completely covers one or more of the anode 610 and/or cathode 612, while in other cases, the diamond layer can be grown around the anode and/or cathode contacts so that they are not covered by the diamond.

Figure 7:
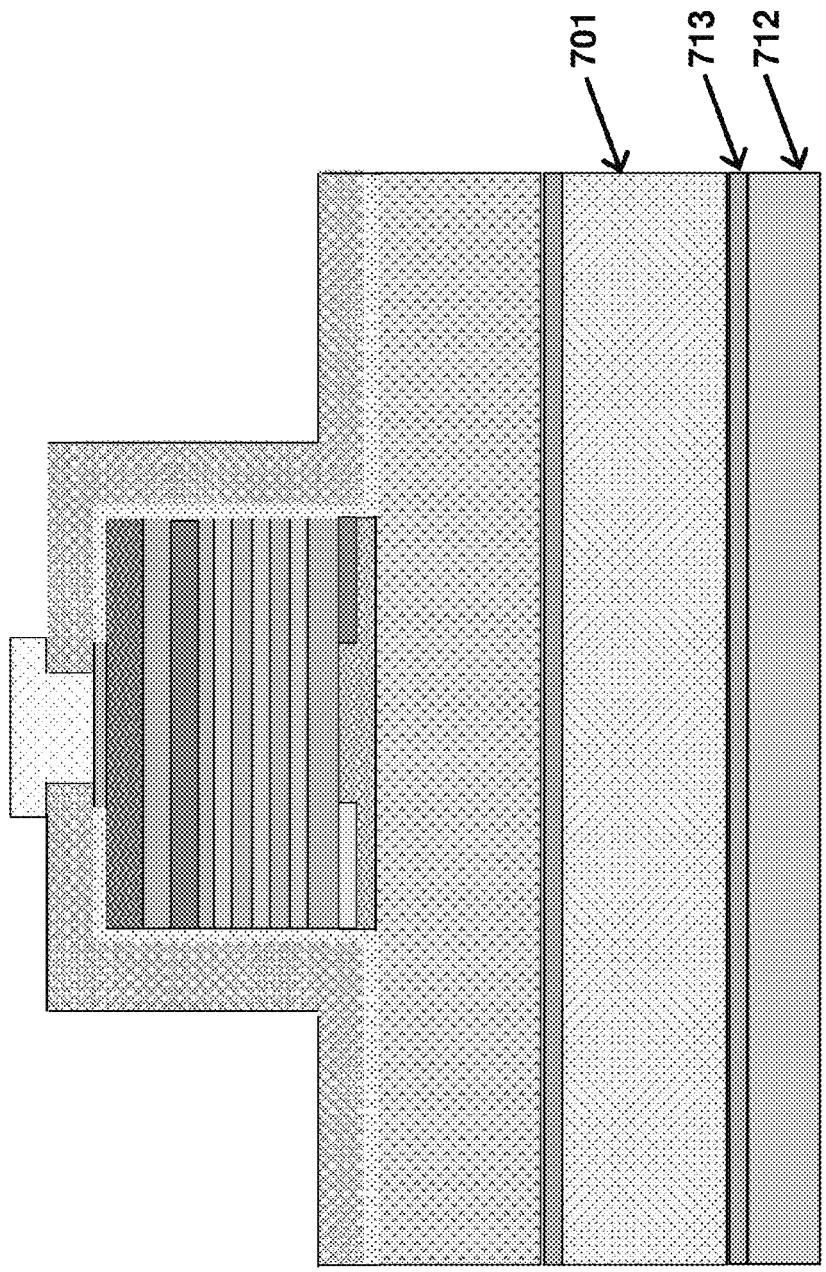
FIG. 7 is a block diagram depicting, in cross-section, another exemplary embodiment of a light-emitting device with integrated diamond in accordance with one or more aspects of the present disclosure.

In still other embodiments, such as the embodiment illustrated in FIG. 7, the cathode 712 and optional separate cathode ohmic metal contact 313 are formed on a back surface of substrate 701 so that the cathode is situated on a backside of the light-emitting structure. A backside light emitting structure typically has low on-resistance than light emitter structures with two topside contacts. In such embodiments, the anode and cathode contacts can be formed either before or after deposition of diamond material layer 709.

Optional Thermal Trenches and Thermal Shunts

FIGS. 8-12 depict embodiments of a light-emitting device having one or more integrated diamond layers which further include an optional thermal trench or thermal shunt etched into the substrate to obtain additional paths for thermal management in the light-emitting device. In many embodiments, the thermal trenches/thermal shunts in the substrate are filled with a metal or metal-containing material, and conduct the heat vertically to the backside of the substrate where the heat is then transported to additional material layers and/or a heat sink. The thermal shunts in the substrate can be arranged so that they either make electrical contact to the cathode or do not electrical contact the active device region. Where the shuts are coated with or filled with metal, they do not necessarily have to perform an electrical function, but they can in some cases be arranged to provide low-inductance ground contact to the cathode of the light-emitting device.

Figure 8:
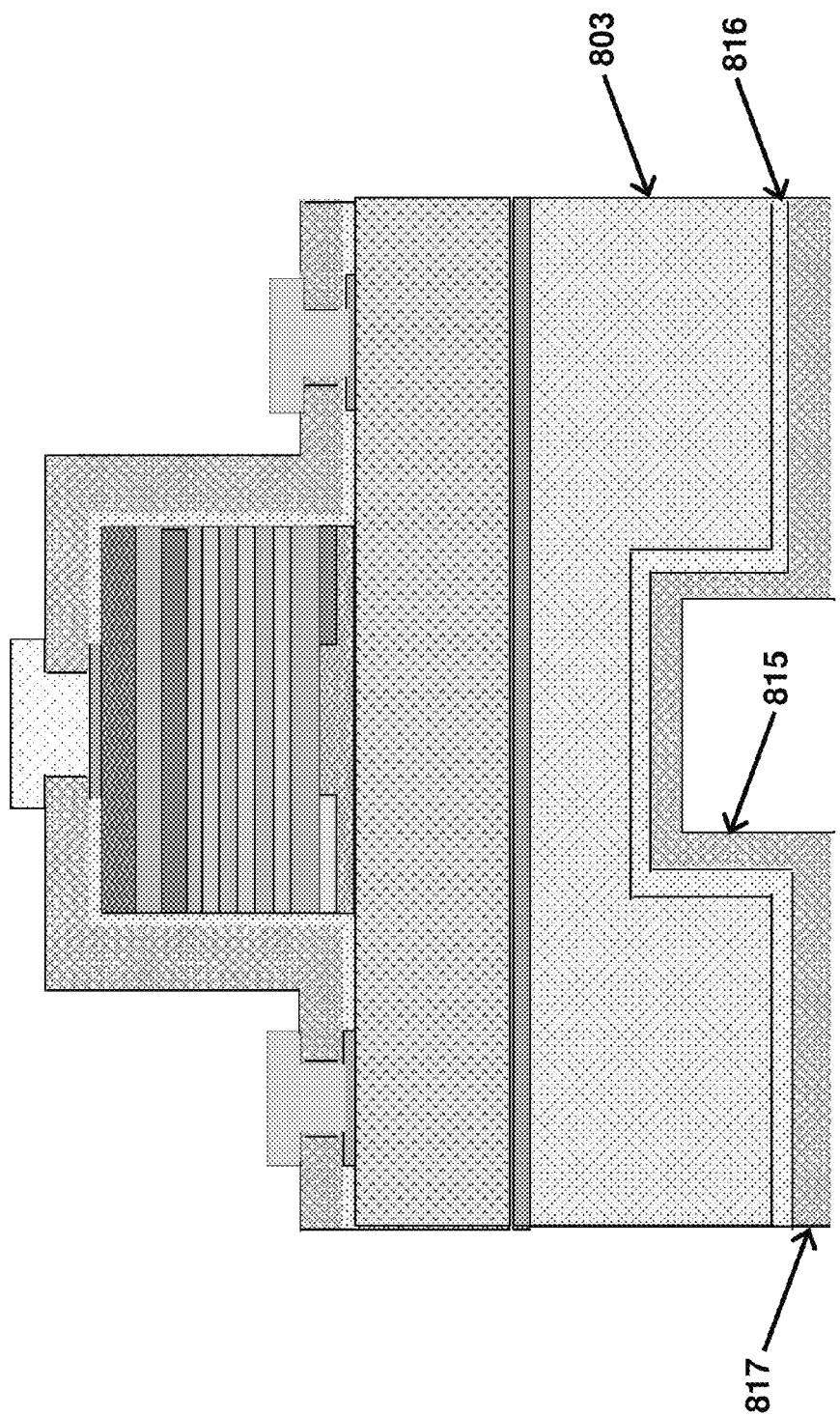
FIG. 8 is a block diagram depicting, in cross-section, another exemplary embodiment of a light-emitting device with integrated diamond in accordance with one or more aspects of the present disclosure.
Figure 9:
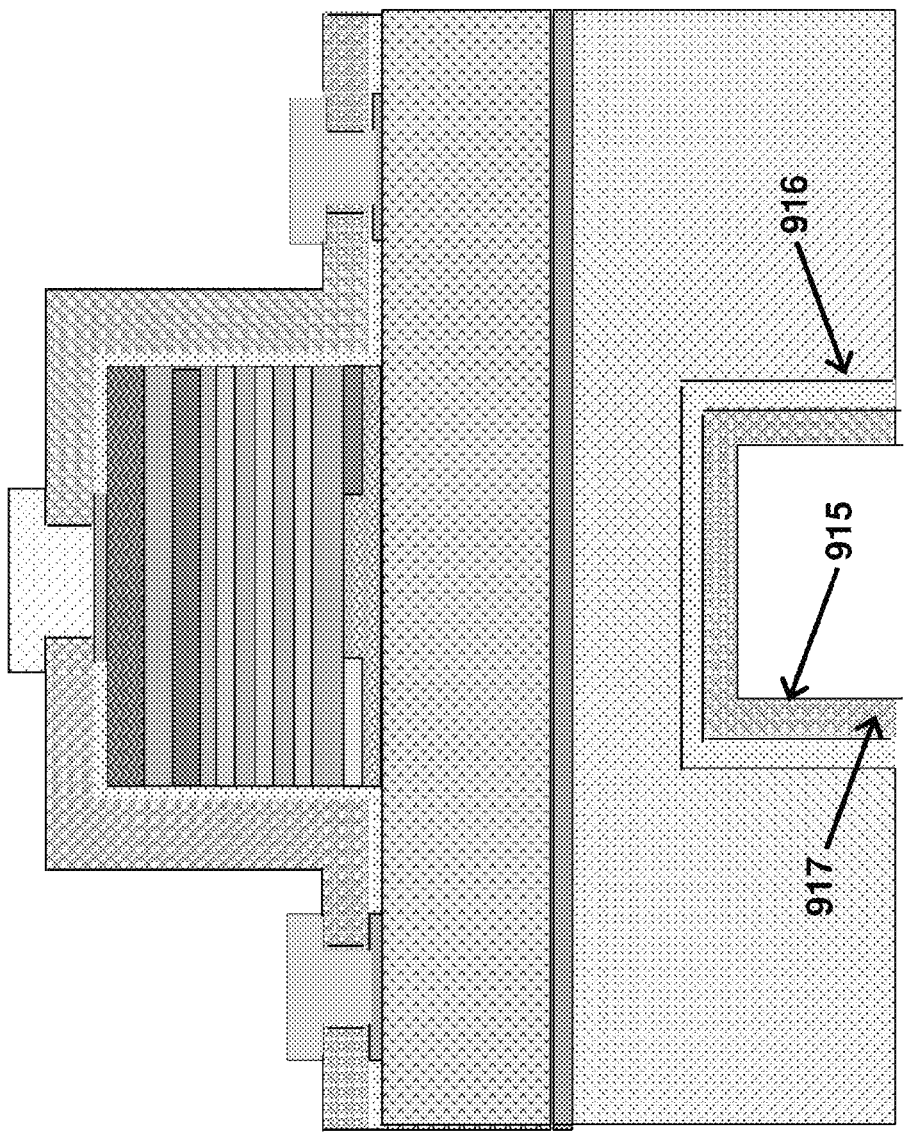
FIG. 9 is a block diagram depicting, in cross-section, another exemplary embodiment of a light-emitting device with integrated diamond in accordance with one or more aspects of the present disclosure.

The block diagrams in FIGS. 8 and 9 illustrate aspects of two exemplary embodiments incorporating a thermal trench/ thermal shunt formed in the substrate. Thus, as illustrated in FIGS. 8 and 9, a light-emitting device having one or more diamond layers incorporated therein in accordance with the present invention can include a trench 815/915 formed in the backside of substrate 803.

In many embodiments, an additional diamond layer 817/ 917 can be formed on the backside of trench 815, either directly on the substrate material or by means of diamond nucleation layer 816/916, and can either extend along the entire the backside of substrate 803 as shown in FIG. 8 or can be confined to trench 915 as shown in FIG. 9.

In other embodiments, the diamond can be patterned so that it does not form a continuous film on the entire backside of the substrate. The advantage of having such a non-continuous film of diamond on the back side of the substrate is that the diamond film will add reduced stress to the substrate because of differences in the linear thermal expansion coefficient of expansion. The linear thermal coefficient of expansion for diamond is about $1.0 \times 10^{-6}$ $K^{-1}$, while silicon has a linear thermal coefficient of expansion of about $2.6 \times 10^{-6}$ $K^{-1}$, SiC has a linear thermal coefficient of expansion of about $4.3 \times 10^{-6}$ $K^{-1}$, InP has a linear thermal coefficient of expansion of about $4.6 \times 10^{-6}$ $K^{-1}$, and GaAs has a linear thermal coefficient of expansion of about $5.8 \times 10^{-6}$ $K^{-1}$. Thus there is a large difference in the linear thermal coefficient of expansion of diamond and common semiconductors that are used to fabricate light emitting devices, and having a discontinuous diamond film on the backside of the substrate will reduce the induced strain into the substrate, aid in reduce bowing of the substrate, and reduce cracking of the substrate as compared to having a continuous diamond film on the back surface.

The depth of the trench into the substrate can extend from the backside of the substrate to within several microns of the front surface. It can be desirable to have a device structure in which the etching of the trench stops at about the interface of the material layers. For example, for a light emitting structure having III-V epitaxial material layers such as GaAs and InGaAs on an indium phosphide substrate, the trench in the indium phosphide substrate can be etched to the GaAs or InGaAs interface. Another example is that for a light emitting structure having III-nitride epitaxial material layers such as GaN on a silicon or silicon carbide substrate, the trench in the silicon or silicon carbide substrate can be etched to the interface of GaN and the silicon or silicon carbide substrate.

In some embodiments, the trench width can be about 2 microns wide. In some embodiments, the trench width can be about 5 microns wide. In some embodiments, the trench width can be about 10 microns wide. In some embodiments, the trench width can be about 20 microns wide. In some embodiments, the trench width can be about 100 microns. In some embodiments, the trench width can be about 500 microns. In some embodiments, the trench with can be about 2000 microns. In some embodiments, the trench width can be about 4000 microns.

In some embodiments, the trench can be aligned to the light emitting device structure using frontside-to-backside photolithography alignment. In some embodiments, the trench can formed in the substrate with no alignment to the light emitting device structure. In some embodiments, there can be multiple trenches in the region beneath the light emitter device structure.

Figure 10:
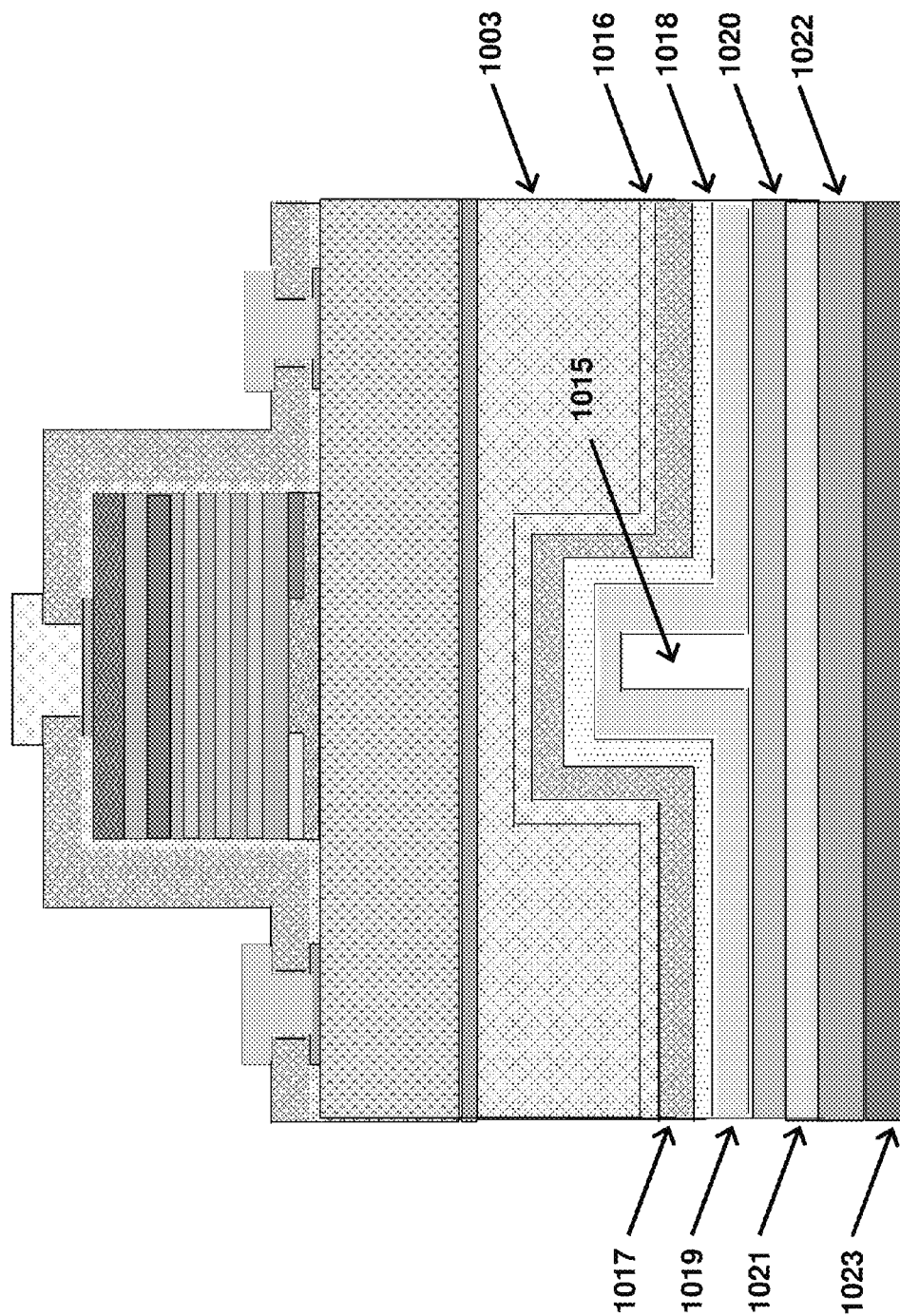
FIG. 10 is a block diagram depicting, in cross-section, another exemplary embodiment of a light-emitting device with integrated diamond in accordance with one or more aspects of the present disclosure.

The block diagram in FIG. 10 illustrates aspects of another embodiment incorporating a thermal trench formed in the substrate, wherein the diamond-coated trench 1015 formed on the backside of the substrate as described above with respect to FIG. 9 can further have one or more metal-containing layers 1019/1020/1021/1022 deposited on the backside of substrate 1003. The metal layers can provide increased thermal conductance from the light emitter device region to the backside of the substrate. The metal layers can also be electrical conductor to the backside of the substrate. The metal layers can also be a mirror layer reflecting light generated by the light emitter device through the front surface of the device structure to improve the light extraction efficiency of the light emitter device.

Thus, as illustrated in FIG. 10, a light-emitting device in accordance with the present invention can include a first metal-containing layer 1019 conformally covering the diamond layer 1017 in the trench, where first metal-containing layer 1019 can be deposited either directly on the diamond or grown by means of seed layer 1018 deposited on the diamond.

In some embodiments, such as is illustrated in FIG. 10, first metal-containing layer 1019 can also extend along the entire backside of the substrate. The light emitting device be mounted on heat sink 1023 having a metal layer 1022 on the front surface of the heat sink using a solder layer 1021. Layer 1020 can be a solder metal layer deposited on the surface of layer 1019 that facilitates the adhesion and wetting of solder material 1021 to the surface of layer 1020. The material composition and/or layer thickness of any one of the additional metal-containing layers 1020, 1021, and 1022 may be the same or different as that of any other of the metal-containing layers 1020, 1021, and 1022.

In other embodiments, first metal-containing layer 1019 may be confined to trench 1015, with a second metal-containing layer 1020 being deposited on the remainder of the substrate backside. In many embodiments such as the one illustrated in FIG. 10, a heat sink or submount 1023 will further remove heat from the light-emitting device.

Figure 11:
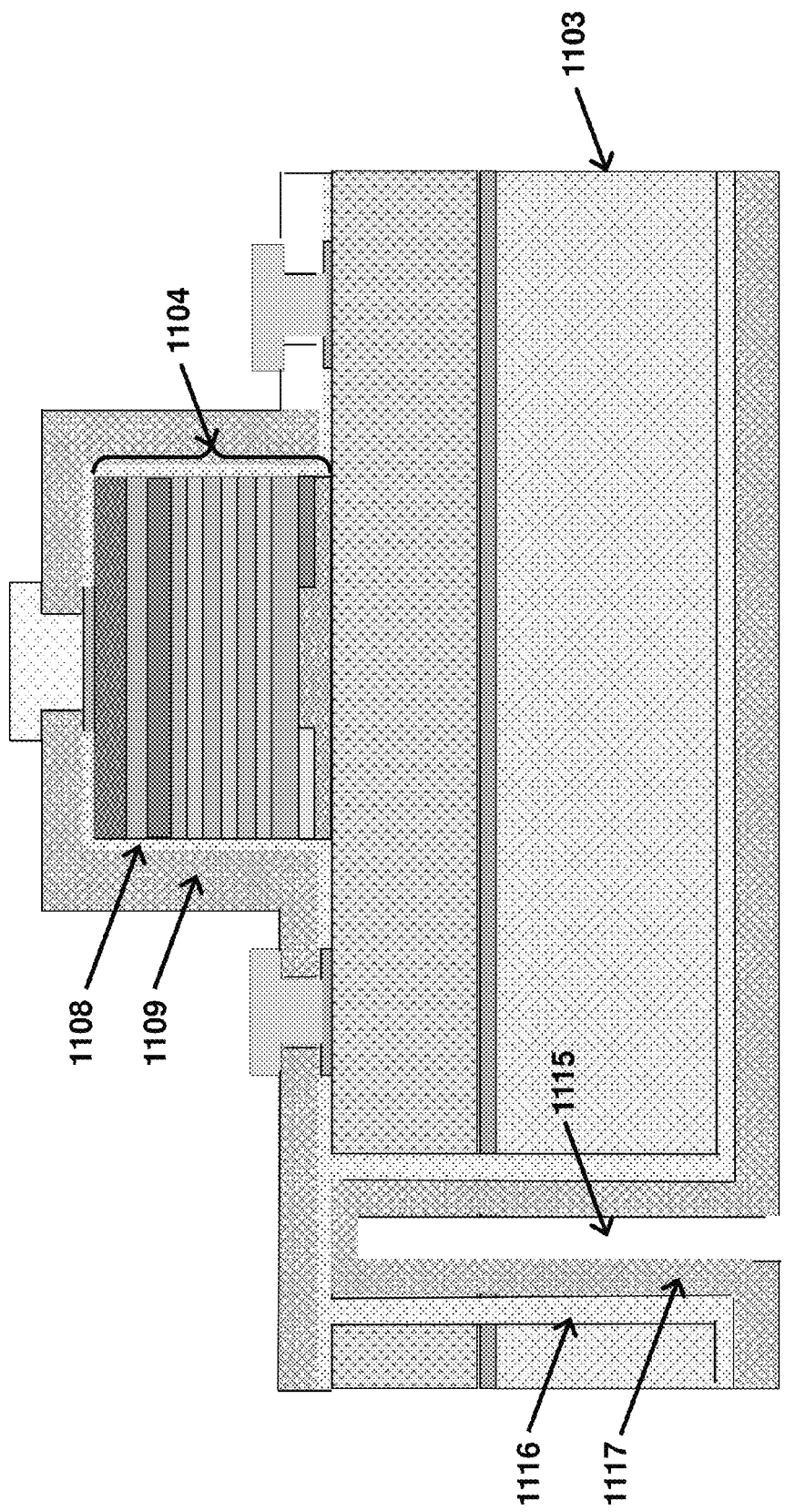
FIG. 11 is a block diagram depicting, in cross-section, another exemplary embodiment of a light-emitting device with integrated diamond in accordance with one or more aspects of the present disclosure.
Figure 12:
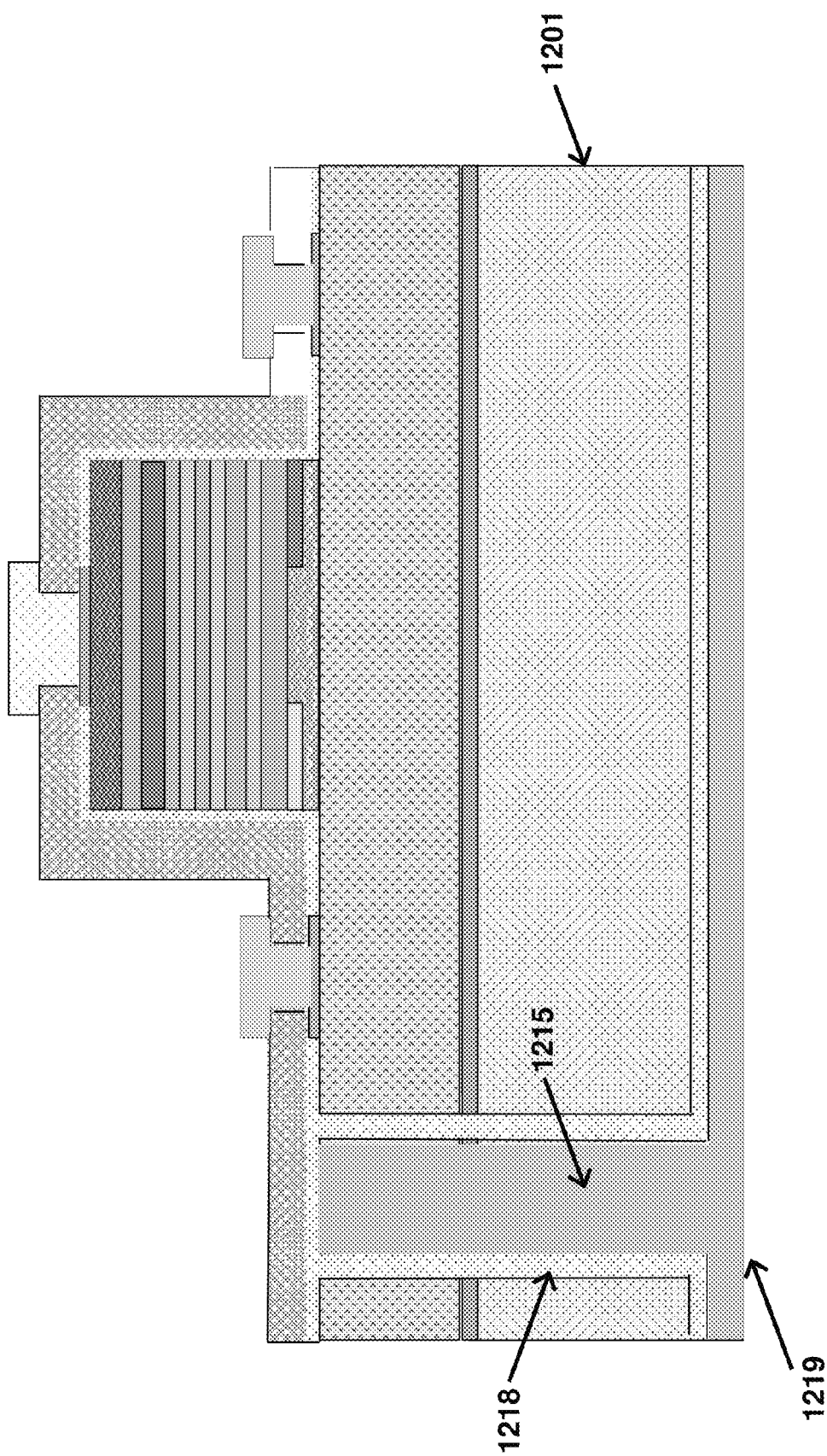
FIG. 12 is a block diagram depicting, in cross-section, another exemplary embodiment of a light-emitting device with integrated diamond in accordance with one or more aspects of the present disclosure.

In the embodiments illustrated in FIGS. 11 and 12, the trench etched in the substrate is in the form of a narrow thermal shunt 1115/1215 situated laterally away from the vertical axis of the light-emitting ridge waveguide. In some embodiments, the trench is etch entirely through the substrate and III-V or III-nitride epitaxial layer. In some embodiments, the trench may be etched to the interface between the substrate and the III-V or III-nitride epitaxial layer. In some embodiments, the thermal shunt is coated with a diamond layer while in other embodiments, the thermal shunt is partially or wholly filled with metal or a metal-containing material.

Thus, as illustrated in FIG. 11, in some embodiments, in addition to having diamond nucleation layer 1108 and diamond layer 1109 grown on ridge waveguide structure 1104, a light-emitting device having one or more diamond layers incorporated therein in accordance with the present invention can have a second diamond layer 1117 grown in thermal shunt 1115, either directly on the surface of the substrate 1103 or on diamond nucleation layer 1116.

In the embodiment shown in FIG. 11, diamond layer 1117 and diamond nucleation layer 1116 extend along the backside surface of the substrate, though just as in the embodiment illustrated in FIG. 9, in other embodiments, diamond layer 1117 may be present only within thermal shunt 1115, while in still other embodiments such as the one illustrated in FIG. 10, one or more additional metal or metal-containing layers can be formed on the backside of the substrate.

In other embodiments, such as that illustrated in FIG. 12, thermal shunt 1215 can be partially or completely filled with a metal material 1219 grown either directly on the backside of substrate 1201 or via nucleation layer 1218. Metal material can be any suitable thermally conducting material, such as copper or tungsten, and as with the embodiment illustrated in FIG. 10, can be combined with additional metal or metal-containing layers formed on the backside of the substrate.

While the embodiments described above are configured for edge emission of light therefrom, in some embodiments, a light-emitting device having one or more diamond layers incorporated therein are configured for vertical emission therefrom.

Figure 13:
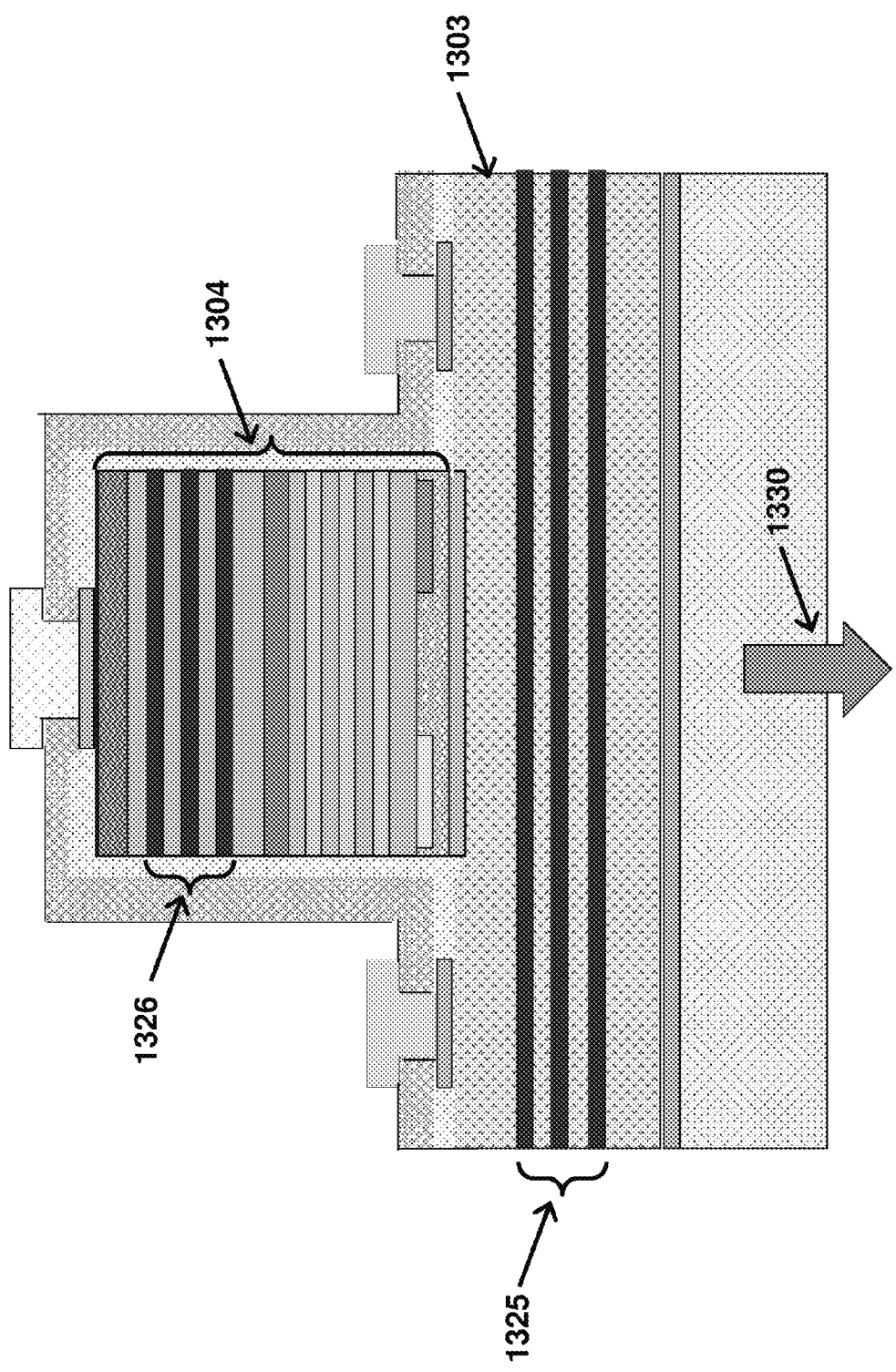
FIG. 13 is a block diagram depicting, in cross-section, another exemplary embodiment of a light-emitting device with integrated diamond in accordance with one or more aspects of the present disclosure.
Figure 14:
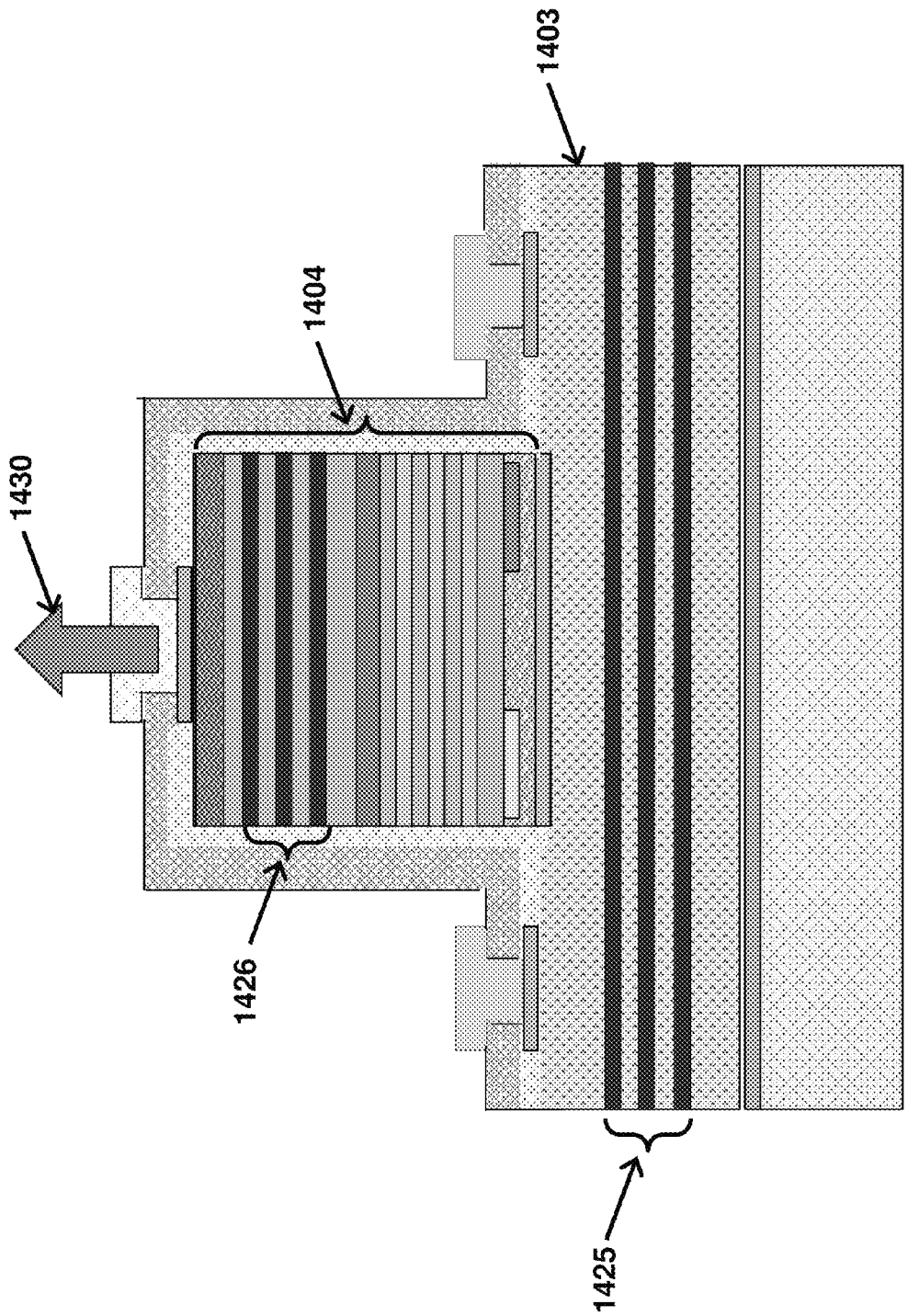
FIG. 14 is a block diagram depicting, in cross-section, another exemplary embodiment of a light-emitting device with integrated diamond in accordance with one or more aspects of the present disclosure.

Aspects of two exemplary configurations of such embodiments are illustrated in FIGS. 13 and 14. As illustrated in FIGS. 13 and 14, in such embodiments, light-emitting structure 1303/1403 and waveguide structure 1304/1404 include a Bragg mirror layer 1325/1425 and 1326/1426, respectively.

Figure 15:
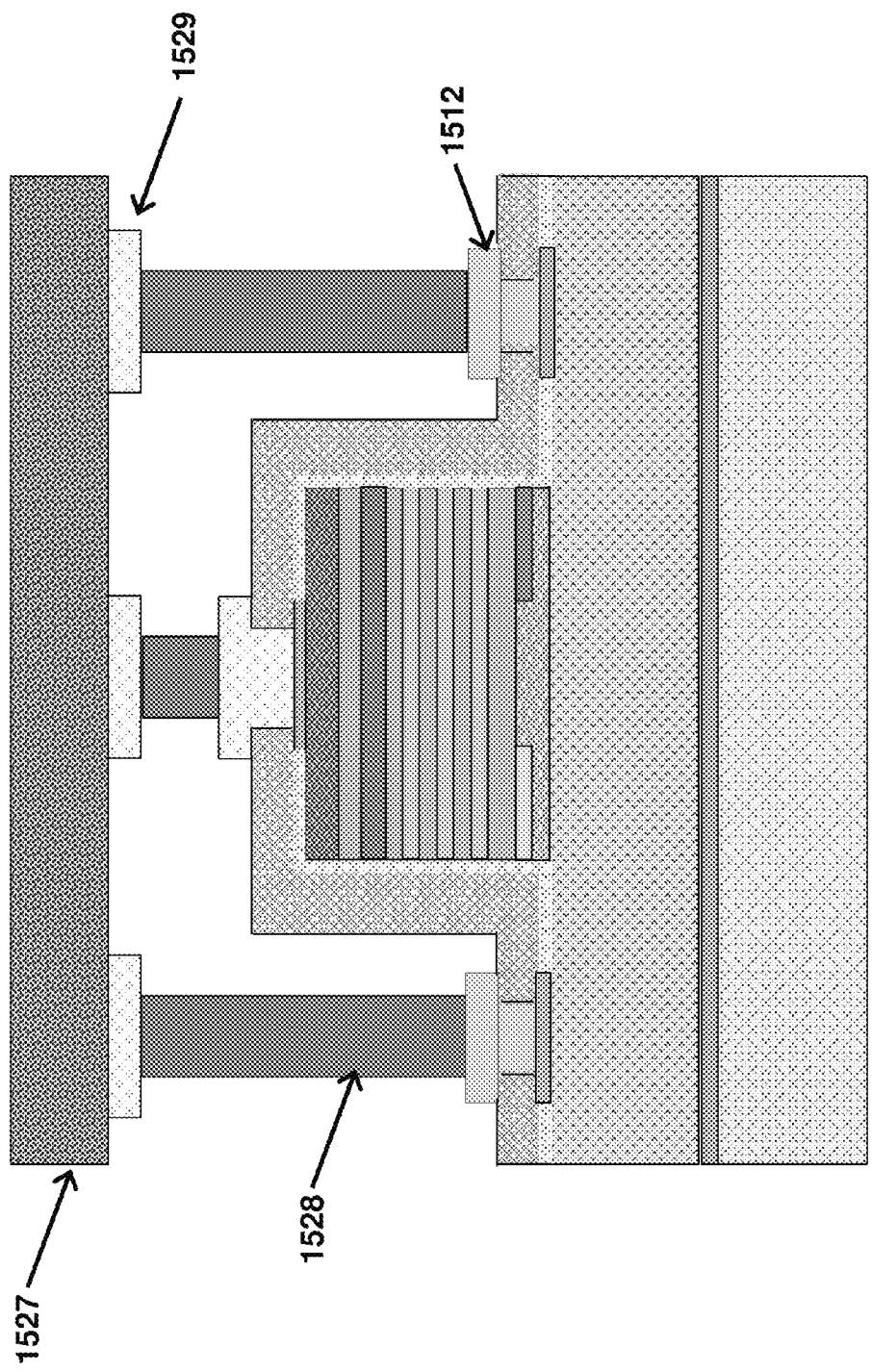
FIG. 15 is a block diagram depicting, in cross-section, another exemplary embodiment of a light-emitting device with integrated diamond in accordance with one or more aspects of the present disclosure.
Figure 16:
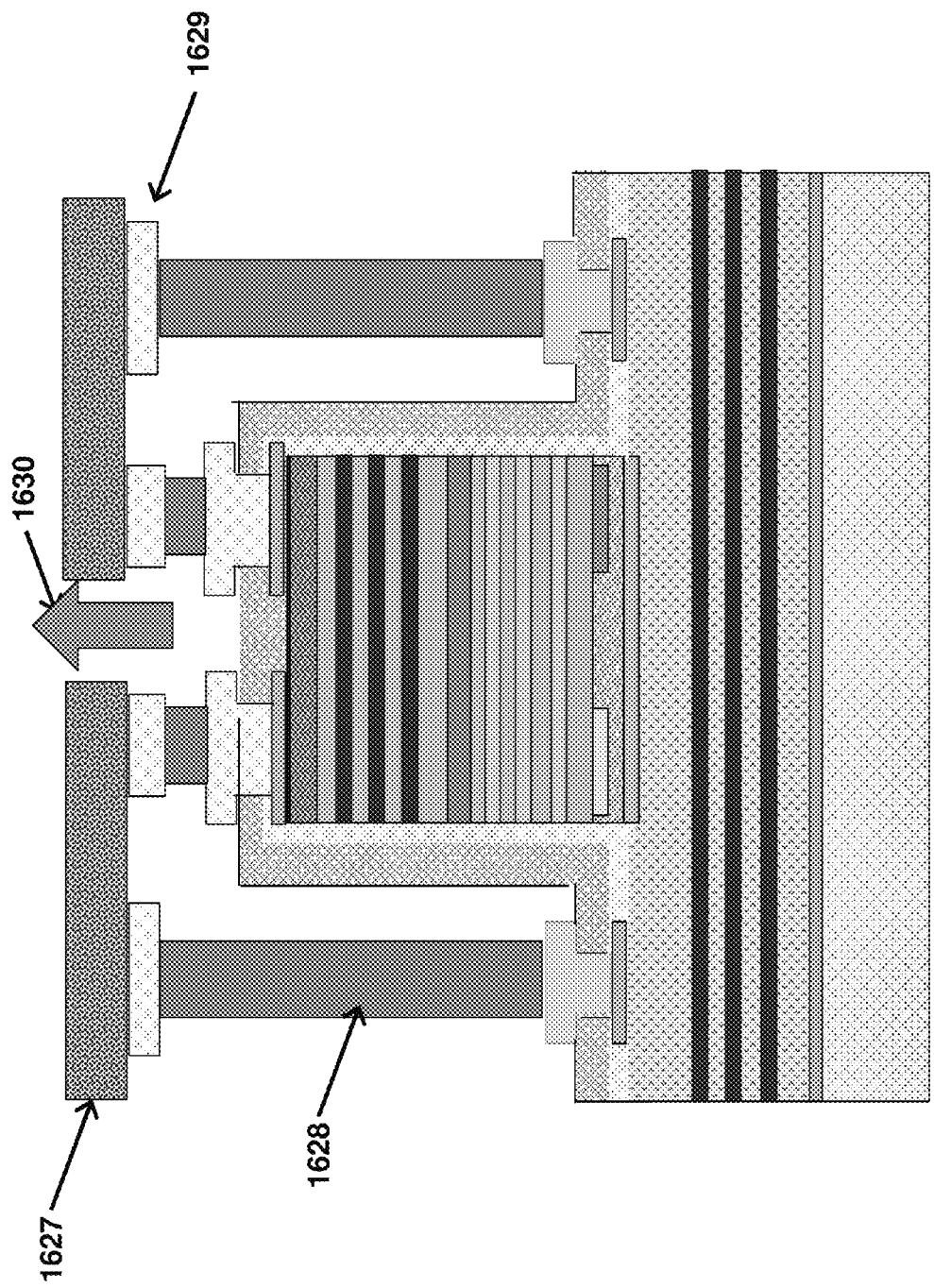
FIG. 16 is a block diagram depicting, in cross-section, another exemplary embodiment of a light-emitting device with integrated diamond in accordance with one or more aspects of the present disclosure.

FIGS. 15 and 16 illustrate aspects of additional embodiments of a light-emitting device incorporating one or more diamond layers therein in accordance with the present invention, where additional thermal management is provided by a heat sink mounted to the device. Thus, as illustrated in FIGS. 15 and 16, a light-emitting device having one or more diamond layers incorporated therein in accordance with the present invention can further include a heat sink 1527/1627 that is mounted to the light-emitting device by means of bump-bonds 1528/1628 between cathode contacts 1512/1612 and anode contacts 1529/1629. The present invention also provides methods for forming a light-emitting device having one or more diamond layers integrated therein.

In some embodiments, such a device includes one or more electrodes fabricated after deposition of a diamond layer on the light-emitting structure. In broad outline, a method for forming such a device includes the following steps:

(1) Grow III-nitride epitaxial layers by MOCVD or MBE;
(2) Optionally grow an in-situ silicon nitride layer (range of thickness of 0.2 nm to 100 nm);
(3) Etch mesa to form ridge waveguide and etch the III-nitride material layer to N+ cathode layer;
(4) Form anode ohmic metal contacts;
(5) Form cathode ohmic metal contacts;
(6) Clean followed by optional plasma nitrogen;

(7) Perform an additional optional cleaning (8) Optionally deposit first dielectric layer on III-nitride ridge waveguide;

(9) Deposit diamond nanoparticle nucleation layer, preferably in the form of a nanocrystalline diamond nucleation layer;

(10) Grow diamond thin film layer, optionally by using a bias-enhanced diamond nucleation process;

(11) Using photolithography, define window openings for anode metal contact and cathode metal contacts using photolithography;

(12) Etch diamond thin film layer to the anode ohmic metal and the cathode ohmic metal for anode metal to first dielectric layer surface either by subtractive etch of diamond or selective growth of diamond;

(13) Etch first dielectric layer to ohmic metal surface;

(14) Clean and/or plasma nitrogen and/or thin dielectric layer deposition;

Optionally etch anode and/or cathode contact windows through the diamond thin film layer to the AlGaN/GaN surface of the light-emitting structure, deposit separate anode and/or cathode ohmic metal, anneal the separate ohmic metal to form ohmic anode and/or cathode ohmic metal contacts, and deposit and define anode and/or cathode metal to form anode and/or cathode contacts;

Form contact window openings in diamond and first dielectric layer to the ohmic metals (if not previously formed during patterning of opening in diamond for anode metal; and Optionally form trench in backside of substrate and deposit and define thick metal layer in substrate.

Although particular embodiments, aspects, and features have been described and illustrated, it should be noted that the invention described herein is not limited to only those embodiments, aspects, and features, and it should be readily appreciated that modifications may be made by persons skilled in the art. The present application contemplates any and all modifications within the spirit and scope of the underlying invention described and claimed herein, and all such embodiments are within the scope and spirit of the present disclosure.

What is claimed is:

1. A light-emitting device having at least one diamond layer integrated therein, comprising:
    a substrate;
    an n-type semiconductor material layer disposed on a topside of the substrate, the n-type semiconductor material layer comprising one of a III-V or a III-nitride semiconductor material;
    a light-emitting ridge waveguide formed from a portion of the n-type material layer, the ridge waveguide including at least one quantum well active region configured to produce and emit photons when subjected to an electrical current, a trench being formed in the substrate on a backside of the device opposite the light-emitting ridge waveguide;
    a second diamond material layer disposed along sidewalls and a top surface of the trench;
    at least one metal-containing material layer disposed on the backside of the substrate and extending laterally along an entire length of the substrate without extending into the trench;
    at least one n-type cathode contacting an upper surface of the n-type semiconductor material layer;
    at least one p-type anode contacting an upper surface of the ridge waveguide; and
    a first diamond material layer grown on a top and sides of the ridge waveguide and on a top surface of the n-type semiconductor material layer.

2. The light-emitting device according to claim 1, wherein the first diamond material layer is grown directly on a surface of the n-type semiconductor material.

3. The light-emitting device according to claim 1, further comprising a first diamond nucleation layer disposed directly on a surface of the n-type semiconductor material, wherein the first diamond material layer is grown on the first diamond nucleation layer.

4. The light-emitting device according to claim 1, further comprising a dielectric material layer disposed between the first diamond material layer and the n-type semiconductor material.

5. The light-emitting device according to claim 1, further comprising a heat sink formed on a backside of the substrate opposite the n-type semiconductor material layer.

6. The light-emitting device according to claim 1, wherein the second diamond material layer extends laterally along an entire length of the substrate.

7. The light-emitting device according to claim 1, further comprising at least one thermal shunt formed on a backside of the substrate and extending through the n-type semiconductor material layer.

8. The light-emitting device according to claim 7, further comprising a second diamond material layer disposed along sidewalls and a top surface of the thermal shunt.

9. The light-emitting device according to claim 7, wherein the thermal shunt is at least partially filled with a metal-containing material.

10. The light-emitting device according to claim 1, wherein the device is configured as an edge-emitting laser.

11. The light-emitting device according to claim 1, wherein the device is configured as a vertical cavity surface-emitting laser.

12. The light-emitting device according to claim 1, wherein the device is configured as a light-emitting diode.

* * * * *